US006630863B2

United States Patent
Tsuchiya

(10) Patent No.: US 6,630,863 B2
(45) Date of Patent: Oct. 7, 2003

(54) DIFFERENTIAL AMPLIFIER, SEMICONDUCTOR DEVICE, POWER SUPPLY CIRCUIT AND ELECTRONIC EQUIPMENT USING THE SAME

(75) Inventor: Masahiko Tsuchiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 88 days.

(21) Appl. No.: 09/817,082

(22) Filed: Mar. 27, 2001

(65) Prior Publication Data

US 2001/0030578 A1 Oct. 18, 2001

(30) Foreign Application Priority Data

Mar. 31, 2000 (JP) ........................................ 2000-098917

(51) Int. Cl.[7] ................................................ H03F 3/45
(52) U.S. Cl. ........................ 330/254; 330/255; 330/261; 330/264
(58) Field of Search ................................ 330/253, 255, 330/261, 264

(56) References Cited

U.S. PATENT DOCUMENTS

| | | | | |
|---|---|---|---|---|
| 4,284,958 | A | | 8/1981 | Pryor et al. |
| 5,216,382 | A | * | 6/1993 | Ito .............................. 330/267 |
| 5,266,887 | A | * | 11/1993 | Smith ......................... 323/316 |
| 5,621,357 | A | * | 4/1997 | Botti et al. .................. 330/253 |
| 5,670,910 | A | * | 9/1997 | Kato ............................ 330/253 |
| 5,751,186 | A | * | 5/1998 | Nakao ......................... 327/562 |
| 5,841,321 | A | * | 11/1998 | Miyake et al. ............... 330/255 |
| 6,100,762 | A | * | 8/2000 | Kato ............................ 330/255 |
| 6,259,322 | B1 | * | 7/2001 | Muza .......................... 330/252 |
| 6,359,512 | B1 | * | 3/2002 | Ivanov et al. ............... 330/255 |

FOREIGN PATENT DOCUMENTS

| | | |
|---|---|---|
| JP | 10-233636 | 9/1998 |
| JP | 11-88076 | 3/1999 |
| KR | 2000-0004448 | 1/2000 |

OTHER PUBLICATIONS

Cordaro, "Complementary Fet Differential Amplifier", IBM Technical Disclosure Bulletin, IBM Corp., New York, vol. 16, No. 10, Mar. 1974, pp. 3227–3228, XP002103389.

Callewaert et al., "Class AB CMOS Amplifiers with High Efficiency", IEEE Journal of Solid–State Circuits, IEEE Inc., New York, vol. 25, No. 3, Jun. 1, 1990, pp. 684–691, XP000140198.

U.S. application Ser. No. 09/817,193, Tsuchiya, filed Mar. 27, 2001, pending.

* cited by examiner

Primary Examiner—Michael Tokar
Assistant Examiner—Khai Nguyen
(74) Attorney, Agent, or Firm—Oliff & Berridge, PLC

(57) ABSTRACT

A differential amplifier comprises first and second differential amplifier circuits. The first differential amplifier circuit includes a first N-type transistor and a second N-type transistor for constituting a differential pair, and operates based on a first input voltage $V_{IN1}$. The second differential amplifier circuit includes a first P-type transistor and a second P-type transistor making up a differential pair, and operates based on a second input voltage $V_{IN2}$. There is also provided a third P-type transistor operable based on a first signal $S_1$ coming from the first differential amplifier circuit and a third N-type transistor operable based on a second signal $S_2$ from the second differential amplifier circuit, wherein a voltage between these third P- and N-type transistors becomes an output voltage $V_{OUT}$.

18 Claims, 6 Drawing Sheets

DIFFERENTIAL AMPLIFIER, SEMICONDUCTOR DEVICE, POWER SUPPLY CIRCUIT AND ELECTRONIC EQUIPMENT USING THE SAME

Japanese patent application No. 2000-98917 filed on Mar. 31, 2000 is hereby incorporated by reference in its entirety.

TECHNICAL FIELD

The present invention relates to a differential amplifier having two sets of differential amplifier circuits, a semiconductor device, a power supply circuit, and electronic equipment using the same.

BACKGROUND

A differential amplifier is shown in FIG. 8, which device has two, first and second differential amplifier circuits 210, 230. The first and second differential amplifier circuits 210, 230 are designed to receive first and second input voltages $V_{IN1}$, $V_{IN2}$ which have an offset therebetween. A P-type MOS transistor 250 is provided at the rear stage of the first differential amplifier circuit 210, which transistor is driven by a first signal $S_1$ coming from the first differential amplifier circuit 210. Similarly, an N-type MOS transistor 252 is provided at the rear stage of the second differential amplifier circuit 230, which transistor is driven by a second signal $S_2$ from the second differential amplifier circuit 230. These PMOS transistor 250 and NMOS transistor 252 are operable to pull together thus defining an output voltage $V_{OUT}$.

As shown in FIG. 8 the first differential amplifier circuit 210 includes a P-type MOS transistor 212 and a P-type MOS transistor 214 that constitutes a current-mirror circuit together with the PMOS transistor 212.

The second differential amplifier circuit 230 includes an N-type MOS transistor 232 and an N-type MOS transistor 234 that makes up a current-mirror circuit together with the NMOS transistor 232.

The first differential amplifier circuit 210 further has an NMOS transistor 216 that is serially connected to the PMOS transistor 212 between power supply voltages $V_{DD}$, $V_{SS}$, and an NMOS transistor 218 as connected in series to the PMOS transistor 214 between the power supply voltages $V_{DD}$, $V_{SS}$. Additionally the NMOS transistors 216, 218 are coupled through a constant current source 220 to the power supply voltage $V_{SS}$. These NMOS transistors 216, 218 are the same as each other both in size and in ability, and thus constitute a differential pair.

Similarly the second differential amplifier circuit 230 has a PMOS transistor 236 that is serially connected to the NMOS transistor 232 between the power supply voltages $V_{DD}$, $V_{SS}$ and a PMOS transistor 238 as series-connected to the NMOS transistor 234 between power supply voltages $V_{DD}$, $V_{SS}$. The PMOS transistors 236, 238 are coupled to power supply voltage $V_{DD}$ via a constant current source 240. These PMOS transistors 236, 238 are the same in size and ability as each other, thus making up a differential pair.

SUMMARY

According to one embodiment, there is provided a differential amplifier comprising:

a first differential amplifier circuit which operates based on a first input voltage and includes a first transistor of a primary conductivity type and a second transistor of the primary conductivity type which makes up a differential pair with the first transistor of the primary conductivity type;

a second differential amplifier circuit which operates based on a second input voltage and includes a first transistor of a secondary conductivity type and a second transistor of the secondary conductivity type which makes up a differential pair with the first transistor of the secondary conductivity type;

a third transistor of the secondary conductivity type which operates based on a first signal from the first differential amplifier circuit;

a third transistor of the primary conductivity type which is serially connected to the third transistor of the secondary conductivity type and operates based on a second signal from the second differential amplifier circuit; and a voltage control circuit (first control circuit) which controls a voltage of a control terminal of the third transistor of the secondary conductivity type, based on a third signal from the second differential amplifier circuit, wherein a voltage between the third transistor of the secondary conductivity type and the third transistor of the primary conductivity type is used as an output voltage.

According to another embodiment, there is provided a differential amplifier in which the first voltage control circuit is replaced by a second voltage control circuit which controls a voltage of a control terminal of the third transistor of the primary conductivity type based on a fourth signal from the first differential amplifier circuit.

According to further embodiment, there is provided a differential amplifier comprising both the first and second voltage control circuits described above. This makes it possible to accelerate the operation of both the third transistor of the secondary conductivity type and the third transistor of the primary conductivity type.

According to yet another embodiment, there is provided a power supply circuit comprising at least one such differential amplifier, or electronic equipment comprising such a power supply circuit.

DETAILED DESCRIPTION

Figure 8:
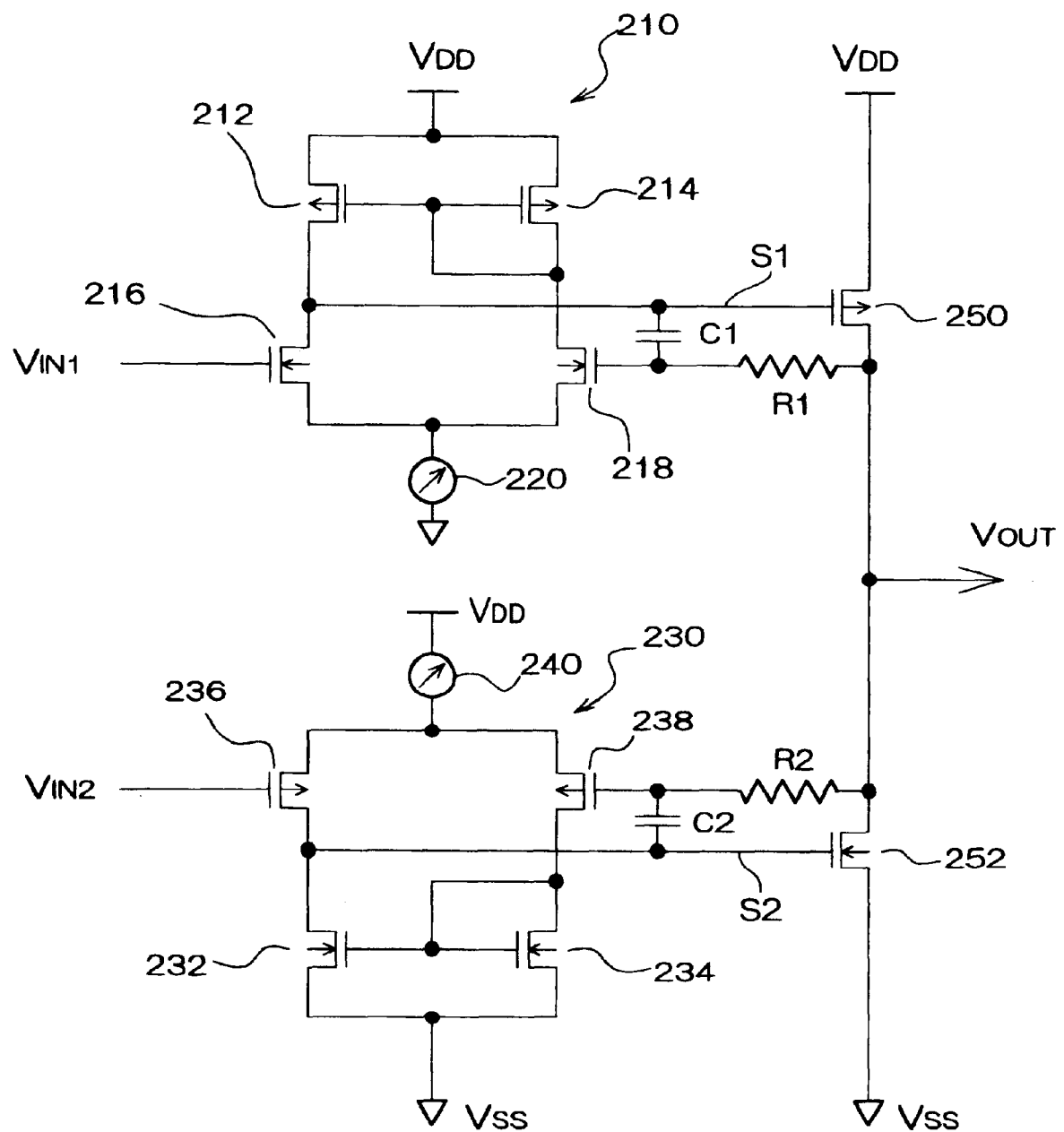
FIG. 8 is a circuit diagram of a differential amplifier.

Here, the approach to stabilizing the output voltage $V_{OUT}$ shown in FIG. 8 at a specified potential level typically includes two cases: increasing the output voltage $V_{OUT}$ from a certain potential level lower than the target voltage to be stabilized, and reducing the output voltage $V_{OUT}$ from a potential level higher than the stabilization voltage.

In the former case, it is required to let a more significant current flow at the PMOS transistor 250 of FIG. 8 while at the same time causing a less current to flow in the NMOS transistor 252. In the latter case the reversed operation thereof is required to be done.

Unfortunately the prior art is encountered with a problem that in the process of the output voltage $V_{OUT}$'s becoming potentially stable, the PMOS transistor 250 and NMOS transistor 252 are low in speed of potential rise-up or drop-down of gate voltages thereof, which in turn makes slow or "decelerates" any intended changes in currents flowing in the PMOS transistor 250 and NMOS transistor 252.

It is therefore an objective of the present invention to provide a differential amplifier, a semiconductor device and power supply circuit capable of operating for letting an output voltage rapidly approach its stable state, and also electronic equipment using the same.

According to one embodiment, there is provided a differential amplifier comprising:

a first differential amplifier circuit which operates based on a first input voltage and includes a first transistor of a primary conductivity type and a second transistor of the primary conductivity type which makes up a differential pair with the first transistor of the primary conductivity type;

a second differential amplifier circuit which operates based on a second input voltage and includes a first transistor of a secondary conductivity type and a second transistor of the secondary conductivity type which makes up a differential pair with the first transistor of the secondary conductivity type;

a third transistor of the secondary conductivity type which operates based on a first signal from the first differential amplifier circuit;

a third transistor of the primary conductivity type which is serially connected to the third transistor of the secondary conductivity type and operates based on a second signal from the second differential amplifier circuit; and a voltage control circuit (first control circuit) which controls a voltage of a control terminal of the third transistor of the secondary conductivity type, based on a third signal from the second differential amplifier circuit, wherein a voltage between the third transistor of the secondary conductivity type and the third transistor of the primary conductivity type is used as an output voltage.

In accordance with this embodiment, the first voltage control circuit can control the voltage at the control terminal of the third transistor of the secondary conductivity type based on the third signal from the second differential amplifier circuit. This makes it possible to permit acceleration of an operation of the third transistor of the secondary conductivity type, enabling the output voltage to rapidly shift to its stable state.

The first voltage control circuit may include a fourth transistor of the primary conductivity type which is connected in parallel with a constant current source of the first differential amplifier circuit; and the third signal may be supplied to a control terminal of the fourth transistor of the primary conductivity type.

Turning on the fourth transistor of the primary conductivity type in response to the third signal makes it possible to control the voltage at the control terminal of the third transistor of the secondary conductivity type.

In this case, the third signal may be identical to a signal which is supplied to a control terminal of the third transistor of the primary conductivity type.

When a first capacitor which prevents oscillation of the output voltage is connected to the control terminal of the third transistor of the secondary conductivity type and the stabilization of the output voltage is delayed, the arrangements set forth above are effective.

According to another embodiment, there is provided a differential amplifier in which the first voltage control circuit is replaced by a second voltage control circuit which controls a voltage of a control terminal of the third transistor of the primary conductivity type based on a fourth signal from the second differential amplifier circuit.

With such an arrangement, the operation of the third transistor of the primary conductivity type can be made faster, thus enabling the output voltage to rapidly shift to the stable state.

The second voltage control circuit may include a fourth transistor of the secondary conductivity type which is connected in parallel with a constant current source of the second differential amplifier circuit; and the fourth signal may be supplied to a control terminal of the fourth transistor of the secondary conductivity type.

Turning on the fourth transistor of the secondary conductivity type in response to the fourth signal makes it possible to control the voltage at the control terminal of the third transistor of the primary conductivity type.

In this case, the fourth signal may be identical to a signal which is supplied to a control terminal of the third transistor of the secondary conductivity type.

When a second capacitor which prevents oscillation of the output voltage is connected to the control terminal of the third transistor of the primary conductivity type and the stabilization of the output voltage is delayed, the arrangements set forth above are effective.

According to further embodiment, there is provided a differential amplifier comprising both the first and second voltage control circuits described above. This makes it possible to accelerate the operation of both the third transistor of the secondary conductivity type and the third transistor of the primary conductivity type.

In accordance with still another embodiment, there is provided a one-chip semiconductor device comprising at least the above-described differential amplifier.

According to yet another embodiment, there is provided a power supply circuit comprising at least one such differential amplifier, or electronic equipment comprising such a power supply circuit.

The embodiments of the present invention will now be described in detail with reference to the accompanying drawings.

1. First Embodiment

An arrangement and operation of the differential amplifier in accordance with one embodiment of the present invention will be described with reference to FIGS. 1 to 4.

1.1 Arrangement of Differential Amplifier

Figure 1:
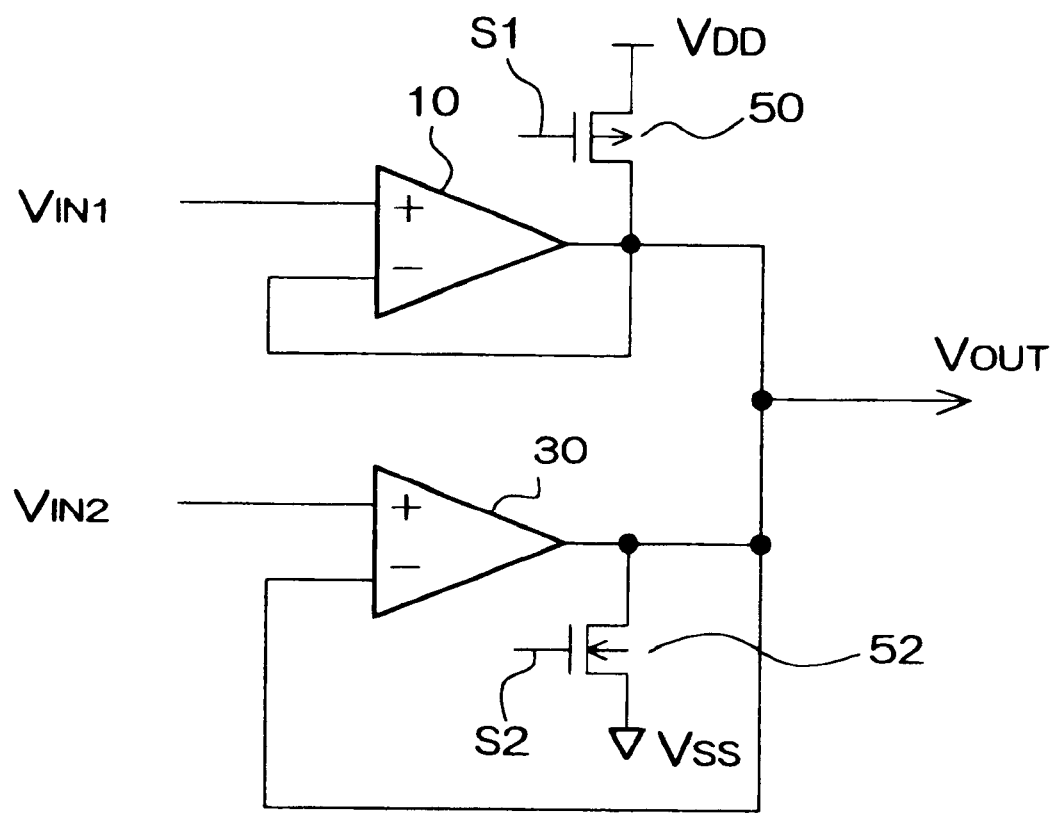
FIG. 1 is a schematic circuit diagram showing a circuit configuration of a differential amplifier in accordance with a first embodiment of the present invention.

Referring to FIG. 1, there is shown a circuit configuration of the differential amplifier in accordance with this embodiment. This differential amplifier shown herein has a first differential amplifier circuit 10 of the voltage follower type which is operable based on a first input voltage $V_{IN1}$ and a second differential amplifier circuit 30 of the voltage follower type operable based on a second input voltage $V_{IN2}$.

Figure 2:
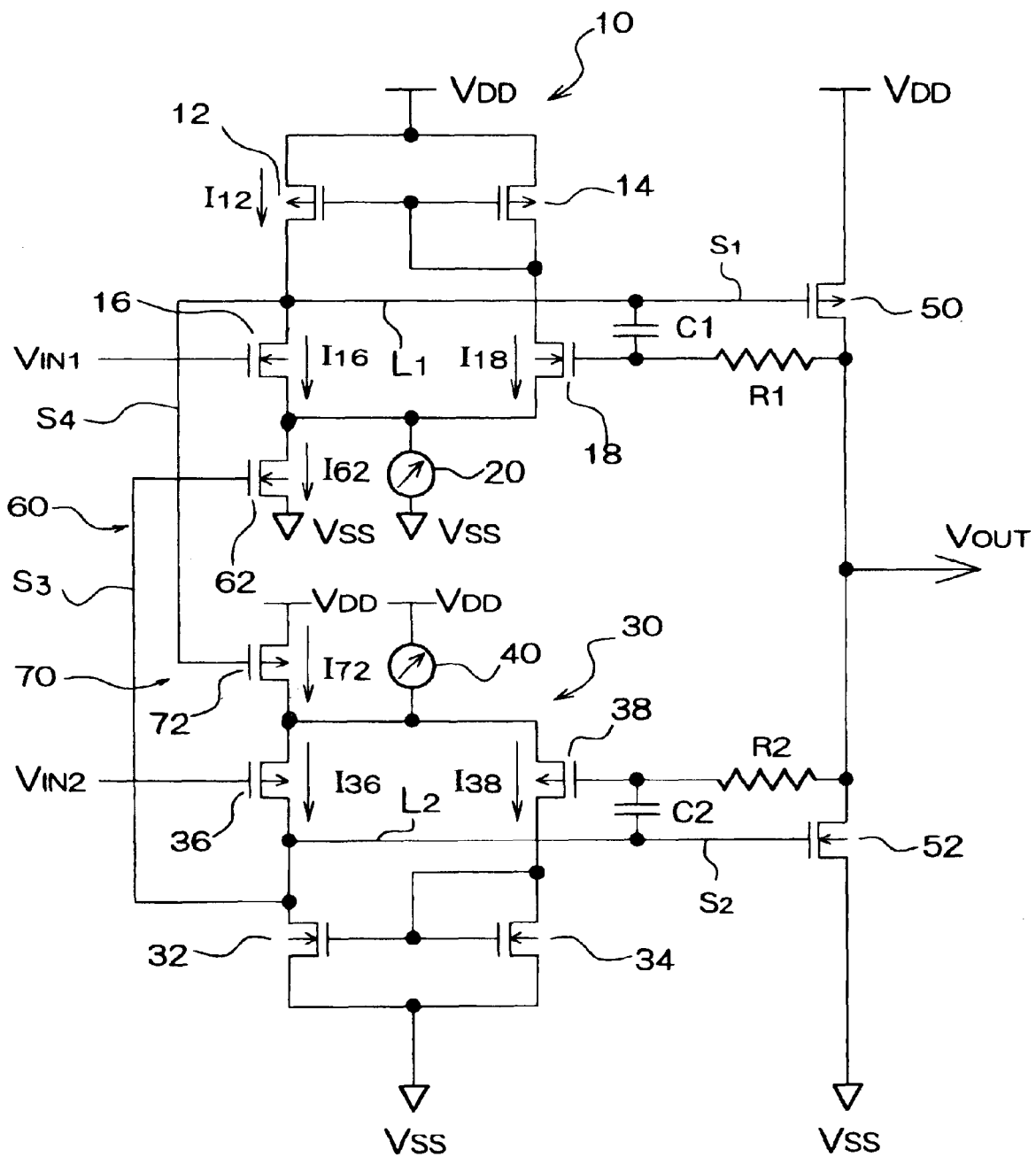
FIG. 2 is a detailed circuit diagram of the differential amplifier shown in FIG. 1.

As shown in FIG. 2 the first differential amplifier circuit 10 includes a P-type MOS transistor 12 and a P-type MOS transistor 14 that constitutes a current mirror circuit together with the P-type MOS transistor 12. These PMOS transistors 12, 14 are the same both in size and in ability as each other, thus making up a current mirror circuit.

The second differential amplifier circuit 30 includes an N-type MOS transistor 32 and an N-type MOS transistor 34 that makes up a current mirror circuit together with the N-type MOS transistor 32. These NMOS transistors 32, 34 also are the same in size and ability as each other to thereby make up a current mirror circuit.

The first differential amplifier circuit 10 further has a MOS transistor 16 of the primary conductivity type that is for example N type (first transistor of the primary conductivity type) which is serially connected to the PMOS transistor 12 between power supply voltages $V_{DD}$, $V_{SS}$, and an N-type MOS transistor 18 (second transistor of the primary conductivity type) which is connected in series to the PMOS transistor 14 between the power supply voltages $V_{DD}$, $V_{SS}$. Note here that these NMOS transistors 16, 18 are connected through a constant current source 20 to the power supply voltage $V_{SS}$. These NMOS transistors 16, 18 are the same in size and ability as each other so that these make up a differential pair.

Similarly the second differential amplifier circuit 30 has a MOS transistor 36 of the secondary conductivity type that is for example P type (first transistor of the secondary conductivity type) as serially connected to the NMOS transistor 32 between the power supply voltages $V_{DD}$, $V_{SS}$, and a P-type MOS transistor 38 (second transistor of the secondary conductivity type) which is series-connected to the N-type MOS transistor 34 between the power supply voltages $V_{DD}$, $V_{SS}$. Note that the PMOS transistors 36, 38 are connected via a constant current source 40 to the power supply voltage $V_{DD}$. These PMOS transistors 36, 38 are the same in size and ability as each other so that they make up a differential pair.

As shown in FIGS. 1 and 2, there are provided a P-type MOS transistor (third transistor of the secondary conductivity type) 50 operable based on a first signal $S_1$ from the first differential amplifier circuit 10 and an N-type MOS transistor (third transistor of the primary conductivity type) 52 operable based on a second signal $S_2$ from the second differential amplifier circuit 30.

These PMOS transistor 50 and NMOS transistor 52 are serially connected together between the power supply voltages $V_{DD}$, $V_{SS}$ whereby a voltage between the PMOS transistor 50 and NMOS transistor 52 becomes an output voltage $V_{OUT}$ of the illustrative differential amplifier. Note that the PMOS transistor 50 is formed to have a large size in view of the fact that its load is significant when the output voltage $V_{OUT}$ potentially drops down, resulting in an increase in gate capacitance thereof.

Also note that as shown in FIG. 2, the first and second differential amplifier circuits 10, 30 are provided with oscillation preventing capacitors $C_1$, $C_2$ and static electricity preventing resistors $R_1$, $R_2$.

The first differential amplifier circuit 10 has a first voltage control circuit 60 which includes an N-type MOS transistor (fourth transistor of the primary conductivity type) 62 as provided in parallel to the constant current source 20. This NMOS transistor 62 has its gate to which a third signal $S_3$ from the second differential amplifier circuit 30 is input. As a result, an operation of the first voltage control circuit 60 for controlling the first signal $S_1$ leads to achievement of control of the gate voltage of the PMOS transistor 50.

Similarly the second differential amplifier circuit 30 has a second voltage control circuit 70 which includes a P-type MOS transistor (fourth transistor of the secondary conductivity type) 72 as provided in parallel to the constant current source 40. This PMOS transistor 72 has a gate to which a fourth signal $S_4$ from the first differential amplifier circuit 10 is input. As a result, an operation of the second voltage control circuit 70 to control the second signal $S_2$ leads to achievement of control of the gate voltage of NMOS transistor 52.

It should be noted that the NMOS transistor 62 and PMOS transistor 72 are set in the turn-off state while the output voltage $V_{OUT}$ of the differential amplifier is stable, causing any current to hardly flow therein.

1.2 Operation of Differential Amplifier

Figure 3:
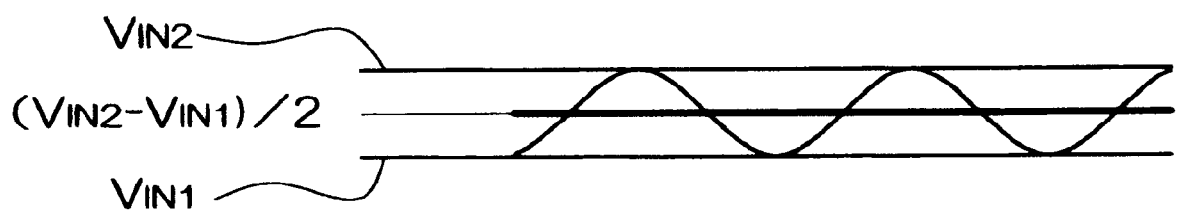
FIG. 3 illustrates an output voltage $V_{OUT}$ of the differential amplifier of FIG. 2.

The output voltage $V_{OUT}$ of the differential amplifier operable based on the first and second input voltages $V_{IN1}$, $V_{IN2}$ is such that as shown in FIG. 3, it is potentially stabilized at an intermediate voltage potential level ($V_{IN1}$−$V_{IN2}$)/2 in the stable state or alternatively becomes a voltage potentially variable between the voltage $V_{IN1}$ and voltage $V_{IN2}$ with its intermediate voltage being as a boundary.

The differential amplifier of the embodiment is capable of rapidly setting the output voltage $V_{OUT}$ at a voltage of the stable state. Its operation will be described below respectively in a case of rapidly increasing the output voltage $V_{OUT}$ and a case of reducing the output voltage toward the stable state.

Figure 4:
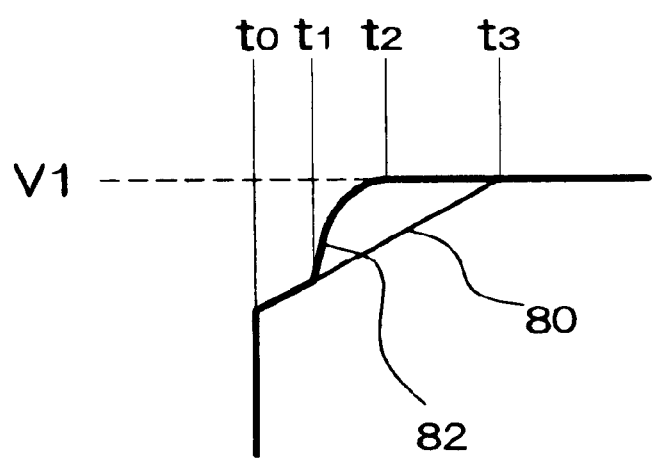
FIG. 4 is a waveform chart showing a process of stabilization of $V_{OUT}$ of the differential amplifier of FIG. 2.

(1) Letting Output Voltage $V_{OUT}$ Rapidly Rise Up Toward Stable State Voltage As shown in FIG. 4, suppose that a voltage in the stable state is $V_1$. Assume that prior to a timing "$t_o$," an output line of the output voltage $V_{OUT}$ is electrically short-circuited to another voltage line(s) by way of example, resulting in that it is lower than the voltage $V_1$.

In this case the gate voltages of the NMOS transistor 18 and PMOS transistor 38 become lower than their inherent stable state voltages.

Note here that since in the first differential amplifier circuit 10 a constant current flows at the constant current source 20 while the NMOS transistor 18 decreases in its gate voltage, a current $I_{18}$ flowing in the NMOS transistor 18 decreases resulting in a current $I_{16}$ increasing accordingly.

Due to this, in the first differential amplifier circuit 10, such increase of current $I_{16}$ results in a likewise decrease in gate voltage $S_1$ of the PMOS transistor 50, thereby causing a change for letting a more current flow at the PMOS transistor 50.

On the contrary, in the second differential amplifier circuit 30, a constant current flows at the constant current source 40 with the PMOS transistors 36, 38 making up the differential pair; accordingly, currents $I_{36}$, $I_{38}$ flowing in PMOS transistors 36, 38 are such that $I_{36}+I_{38}$=constant. And, in view of the fact that the PMOS transistor 38 decreases in its gate voltage in the way stated supra, the current $I_{38}$ flowing in the PMOS transistor 38 increases resulting in the current $I_{36}$ decreasing by a degree corresponding to such current increase.

Due to this, at the second differential amplifier circuit 30, such decrease of current $I_{36}$ results in a likewise decrease in gate potential of the NMOS transistor 52, causing a change for letting a less current flow in NMOS transistor 52.

In this way, as a result of the flow of a more current at the PMOS transistor 50 while at the same time letting a less current flow in the NMOS transistor 52, these PMOS transistor 50 and NMOS transistor 52 operate to push and pull each other causing the output voltage $V_{OUT}$ of the push-pull type differential amplifier to potentially go high toward the stable voltage $V_1$ of FIG. 4.

The process of the output voltage $V_{OUT}$'s potential riseup as explained above is a change as indicated by thin line 80 in FIG. 4, which calls for a relatively long time period of time ($t_3$–$t_o$).

The reason of this is that with the above-stated operation only, the PMOS transistor 50 and NMOS transistor 52 stay slow in potential riseup or dropdown of gate voltages thereof, resulting in that any available changes in currents flowing at PMOS transistor 50 and NMOS transistor 52 stay slow.

More specifically, the gate voltage of the PMOS transistor 50 is given as a voltage that is charged at the oscillation preventing capacitor $C_1$ and a gate capacitance of the PMOS transistor 50 and also the parasitic lead capacitance of a gate line $L_1$ shown in FIG. 2. Its charge-up time is determinable by the gate line $L_1$'s lead capacitance and the ability of constant current source 20.

Similarly the gate voltage of the NMOS transistor 52 is represented by a voltage that is charged up at the oscillation prevention capacitor $C_2$ and a gate capacitance of the NMOS transistor 52 plus the parasitic lead capacitance of a gate line $L_2$ as shown in FIG. 2. Its charge time is determinable by the gate line $L_2$'s lead capacitance and the ability of constant current source 40.

Then, with the illustrative embodiment, the first and second voltage control circuits 60, 70 are used to cause the PMOS transistor 50 and NMOS transistor 52 to rapidly change in gate voltages thereof.

More specifically, in the second differential amplifier circuit 30, a decrease in current $I_{36}$ results in a likewise decrease in voltage of the third signal $S_3$ (this voltage is equal to a voltage on the gate line $L_2$ of NMOS transistor 52). As a result, the gate voltage of the NMOS transistor 62 as provided in the first differential amplifier circuit 10 gets lower causing a current $I_{62}$ flowing in NMOS transistor 62 to decrease accordingly. At this time an operation of the PMOS transistor 50 will be determined by such current flowing in the constant current source 20.

On the other hand, in the first differential amplifier circuit 10, the gate line $L_1$ goes low in potential resulting in a decrease in voltage of the fourth signal $S_4$, which is equal to the voltage on the gate line $L_1$. This would result in a decrease in gate voltage of the PMOS transistor 72 as provided in the second differential amplifier circuit 30 causing a current $I_{72}$ flowing in PMOS transistor 72 to increase accordingly.

Thus a current flowing in the differential pair and current mirror of the second differential amplifier circuit 30 becomes greater. At this time an operation of the NMOS transistor 52 is accelerated because of the fact that the current $I_{72}$ of PMOS transistor 72 is added to the constant current source 40 although the total value of capacitance components parasitically associated with the gate line $L_2$ is kept unchanged.

The process of potential riseup of the output voltage $V_{OUT}$ based on this additional operation is indicated by solid line 82 in FIG. 4. As shown in FIG. 4, with this embodiment, it is possible to shorten a time as taken to reach the intended stable state at ($t_2$–$t_0$) due to an increase in riseup rate of the output voltage $V_{OUT}$ at the timing $t_1$ whereat the NMOS transistor 72 turns on, thereby enabling the output voltage $V_{OUT}$ to rapidly become stabled at increased speeds.

(2) Letting Output Voltage $V_{OUT}$ Rapidly Drop Down To Stable State Voltage

In this case the gate voltages of the NMOS transistor 18 and PMOS transistor 38 become higher than their inherent stable state voltages.

Accordingly the current $I_{18}$ flowing in the NMOS transistor 18 increases with an increase in its gate voltage whereas the current $I_{16}$ flowing in the NMOS transistor 16 decreases by a degree corresponding thereto.

Due to this, in the first differential amplifier circuit 10, such reduction of the current $I_{16}$ results in an increase in gate potential of the PMOS transistor 50, thus causing a less current to flow at the PMOS transistor 50.

On the other hand, in the second differential amplifier circuit 30, the current $I_{38}$ flowing in the PMOS transistor 38 decreases with an increase in gate voltage thereof, causing the current $I_{36}$ flowing in PMOS transistor 36 to increase by a degree corresponding thereto.

Due to this, at the second differential amplifier circuit 30, an increase in current $I_{36}$ results in an increase in gate potential of the NMOS transistor 52 causing a more current to flow in NMOS transistor 52.

Furthermore, in the first differential amplifier circuit 10, the decrease of current $I_{16}$ results in the fourth signal $S_4$ going high in potential, which is equal to the voltage on the gate line $L_1$. As a result the PMOS transistor 72 as provided in the second differential amplifier circuit 30 potentially increases in gate voltage causing the current $I_{72}$ flowing in PMOS transistor 72 to decrease accordingly.

At this time an operation of the NMOS transistor 52 is to be determined by a current of the constant current source 40.

On the other hand, in the second differential amplifier circuit 30, the voltage on the gate line $L_2$ of NMOS transistor 52 potentially goes high causing the third signal $S_3$ to likewise increase (this voltage is equal to the voltage on gate line $L_2$ of NMOS transistor 52). As a result the NMOS transistor 62 as provided in the first differential amplifier circuit 10 gets higher in gate voltage resulting in an increase in current $I_{62}$ flowing in NMOS transistor 62.

Consequently a current flowing through the differential pair and current mirror circuit of the first differential amplifier circuit 10 increases. This finally serves to accelerate the operation of PMOS transistor 50 because of the fact that the current $I_{62}$ flowing in NMOS transistor 62 is added to the current of the constant current source 20 although the total value of capacitances parasitically associated with the gate line $L_1$ remains unchanged.

In this way, as a result of the flow of a less current at the PMOS transistor 50 while simultaneously allowing a more current to flow in the NMOS transistor 52, these PMOS transistor 50 and NMOS transistor 52 pull up together forcing the output voltage $V_{OUT}$ to potentially go low toward the intended stable voltage.

It must be noted that one possible reason for slow down of the stabilization of the output voltage $V_{OUT}$ is the presence of the oscillation prevention capacitors $C_1$, $C_2$ shown in FIG. 2. Thus, the above-stated measures can be done for differential amplifier circuitry with capacitors of this type added thereto. If one of the first and second differential amplifier circuits 10 and 30 has no capacitor such an oscillation preventing capacitor, it will not always necessary to implement these measures for the differential amplifier circuit with no such capacitors. As a consequence, there must be a case where only one of the first and second differential amplifier circuits 60, 70 is disposed.

2. Second Embodiment

The description will next be given of a power supply circuit of a liquid crystal display device in accordance with a second embodiment of the present invention with reference to FIGS. 5 to 7 also.

2.1 Arrangement and Operation of Liquid Crystal Display Device

Figure 5:
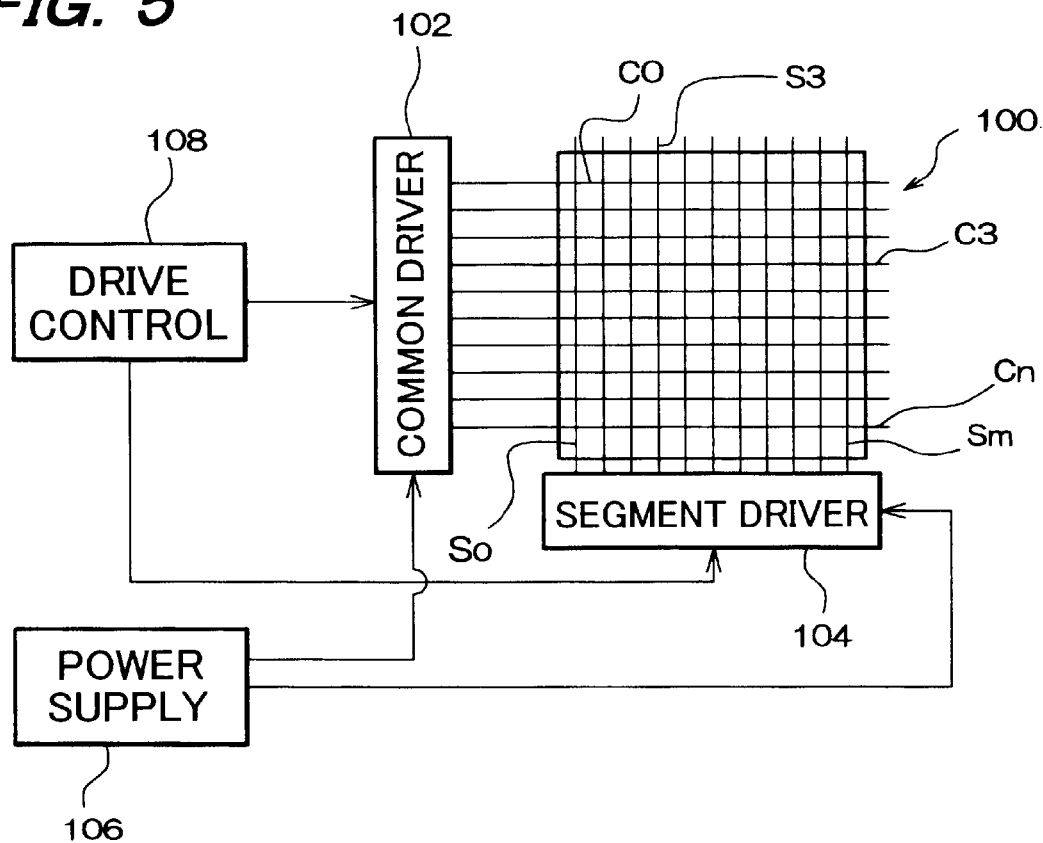
FIG. 5 schematically shows a liquid crystal display in accordance with a second embodiment of the present invention.

FIG. 5 shows a configuration of main part of the liquid crystal display device. In FIG. 5, a liquid crystal display unit, e.g. simple matrix type liquid crystal display unit 100, is arranged to include a first substrate with common electrodes $C_0$ to $C_m$ formed thereon, a second substrate with segment electrodes $S_0$ to $S_n$ formed thereon, and a layer of liquid crystal material as sealed and interposed between the first and second substrates. A single one of the common electrodes and one of the segment electrodes cross over each other at an intersection, which becomes a pixel. The liquid crystal display unit 100 has (m+1)×(n+1) pixels.

Note that the liquid crystal display device in accordance with the second embodiment may also employ other liquid crystal display units such as an active-matrix liquid crystal display device or else in place of the simple-matrix liquid crystal display unit 100.

The common electrodes $C_0$ to $C_m$ are connected with a common driver 102 whereas the segment electrodes $S_0$ to $S_n$ are with a segment driver 104. These common driver 102 and segment driver 104 receive specified voltages as supplied from a power supply circuit 106 for selectively supplying, based on signals from a drive control circuit 108, such specified voltages to the common electrodes $C_0$ to $C_m$ or segment electrodes $S_0$ to $S_n$.

Figure 6:
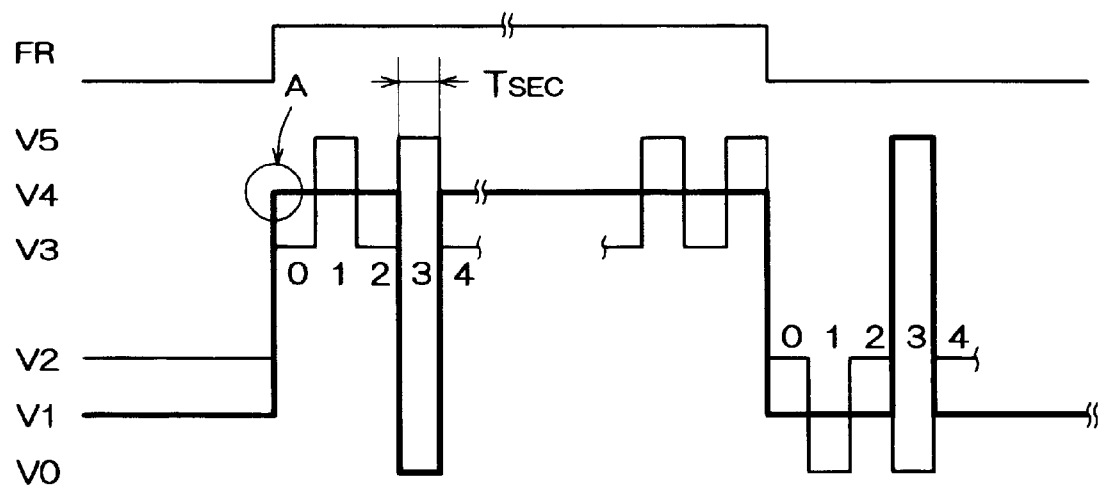
FIG. 6 is a waveform chart showing drive waveforms of the liquid crystal display of FIG. 5.

Here, there is shown in FIG. 6 one example of drive waveforms within a frame period for selection of a common electrode $C_3$ of the liquid crystal display unit 100 shown in FIG. 5.

In FIG. 6, thick or "fat" line is used to designate a drive waveform as supplied from the common driver 102 to respective common electrodes $C_0$ to $C_m$ whereas thin line indicates a drive waveform being supplied from the segment driver 104 to a respective one of the segment electrodes $S_0$ to $S_n$.

As shown in FIG. 6 the drive waveform as supplied from the common driver 102 changes among voltages $V_0$, $V_1$, $V_4$ and $V_5$. On the other hand the drive waveform supplied from the segment driver 104 varies among voltages $V_0$, $V_2$, $V_3$ and $V_5$.

2.2 Arrangement of Power Supply Circuit

Figure 7:
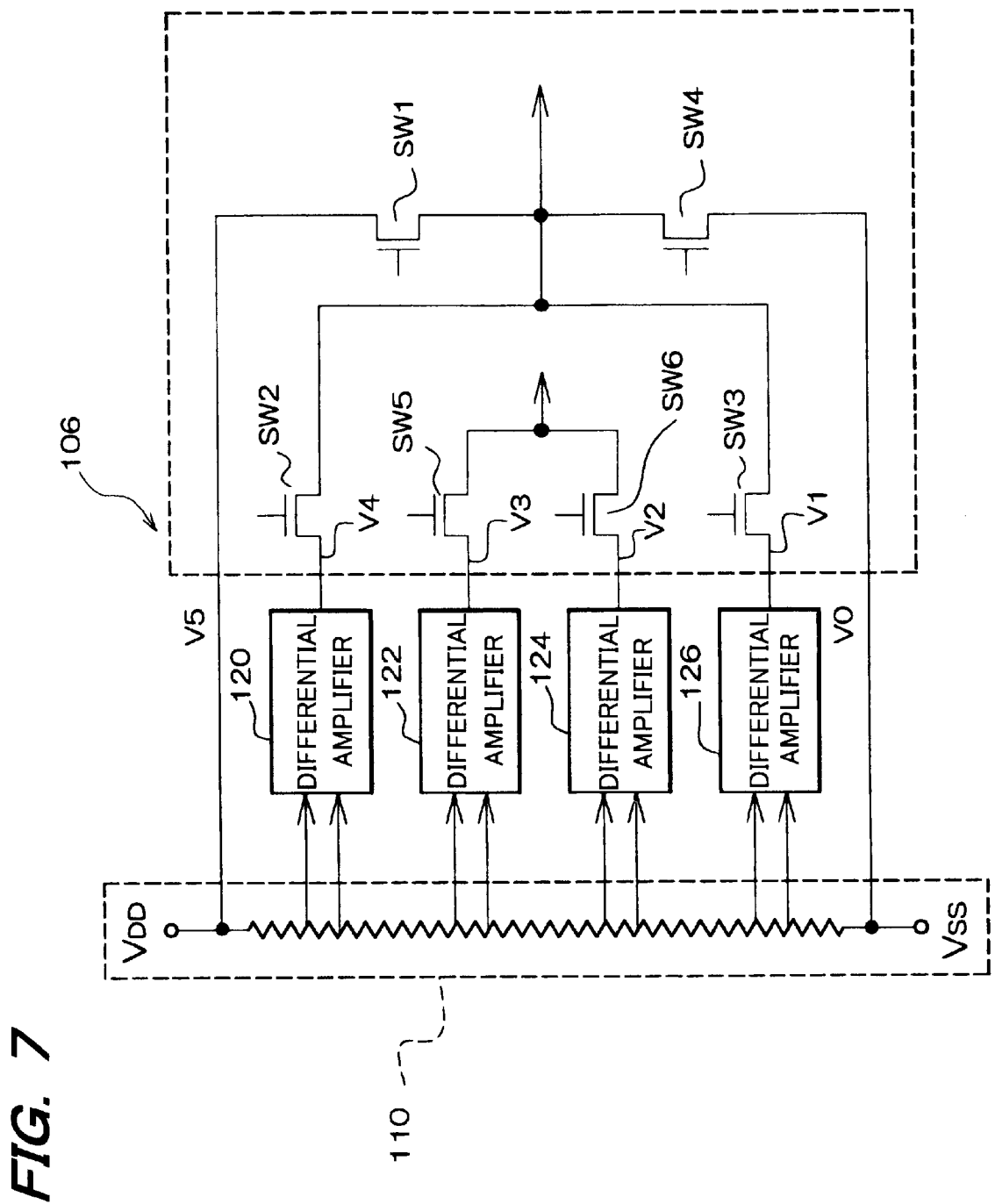
FIG. 7 is a circuit diagram of a power supply circuit for use in the liquid crystal display of FIG. 5.

FIG. 7 shows details of the power supply circuit 106 shown in FIG. 5. As shown in FIG. 7, letting any two of switches $SW_1$ to $SW_6$ turn on makes it possible to select one of the voltages $V_0$, $V_1$, $V_4$, $V_5$ being supplied to the common driver 102 and one of the voltages $V_0$, $V_2$, $V_3$, $V_5$ as supplied to the segment driver 104.

Here, the power supply voltage $V_{DD}$ is used as the voltage $V_5$; power supply voltage $V_{SS}$ is used as the voltage $V_0$; and, the voltages $V_4$ to $V_1$ are generated by resistive voltage division of a voltage ($V_5$–$V_0$). To this end, the power supply circuit 106 has a resistance type potential divider circuit 110 and four separate differential amplifiers 120, 122, 124, 126. The four differential amplifiers 120–126 receive first and second input voltages $V_{IN1}$, $V_{IN2}$ as input thereto via the resistance divider circuit 110 respectively and then output as their output voltages respective one of $V_4$, $V_3$, $V_2$ and $V_1$. And these four differential amplifiers 120 to 126 each have the arrangement of FIG. 2. Additionally the power supply circuit 106 shown in FIG. 7 is configurable as a discrete or "stand-alone" component or, alternatively, into the form of a one-chip IC with the common driver 102 and segment driver 104 shown in FIG. 5 being integrated together.

2.3 Operation of Power Supply Circuit

The operation of the differential amplifier as has been explained previously by using FIGS. 2 and 4 is directly applied to an operation of the differential amplifier 126 shown in FIG. 7 with the voltage $V_1$ being as its output voltage $V_{OUT}$, which leads to improvements in waveform at part "A" shown in FIG. 6.

More specifically, when the switch $SW_3$ of FIG. 7 turns on, an output line of the differential amplifier 126 is electrically shorted via the common driver 102 to the common electrode $C_3$ of the liquid crystal display unit 100. At this time a voltage of the common electrode has been the voltage $V_5$ due to polarity inversion driving as shown in FIG. 6, such shorting results in the output voltage $V_{OUT}$ of differential amplifier 126 potentially dropping down below the voltage $V_1$. In order to permit this output voltage $V_{OUT}$ to rapidly become stable in such a way as to follow or "trace" its riseup process indicated by fat line 182 in FIG. 4, the first and second voltage control circuits 60, 70 of FIG. 2 will be rendered operative.

Here, the waveform of the part "A" of FIG. 6 becomes rounded upon influence of parasitic capacitance components of the common electrodes also. This waveform rounding at the part "A" causes contrast reduction and so-called "stringiness" phenomena to appreciably increase at the liquid crystal display unit 100: these problems become more serious with a decrease in length of a selection time period $T_{SEC}$ of FIG. 6. The greater the pixel number, the shorter the selection period $T_{SEC}$, causing the image quality degradation that is more serious in high-precision display units.

As in the illustrative embodiment, onscreen display images may be improved in quality by reducing or suppressing any possible waveform rounding at voltage change points such as the part "A" shown in FIG. 6 or the like.

Here, the differential amplifiers 120 to 126 are such that in case stabilization is established after letting the output voltage $V_{OUT}$ of each device have increased in potential, it is effective to cause the NMOS transistor 62 of the first voltage control circuit 60 to turn on to thereby quickly make higher the gate voltage of PMOS transistor 50 for acceleration of the operation thereof. Adversely the differential amplifiers 120 to 126 are such that in case stabilization is done after letting the output voltage $V_{OUT}$ of each device have dropped down in potential, it is effective to lessen the current $I_{72}$ flowing in the PMOS transistor 72 of the second voltage control circuit 70 to thereby rapidly make higher the gate voltage of NMOS transistor 52 for acceleration of its operation.

Incidentally it is apparent by referring to FIG. 6 that arrival at the voltage $V_1$ takes place only when rising up from the voltage $V_4$ or $V_5$ and also that arrival at the voltage $V_4$ occurs only when dropping down from the voltage $V_0$ or $V_1$. It can also be seen that arrival at voltage $V_2$ occurs with increased frequency when dropping down from the voltage $V_0$ whereas arrival at voltage $V_3$ occurs in most cases when rising up from voltage $V_5$.

Accordingly the differential amplifiers 120, 124 of FIG. 7 that output the voltages $V_4$, $V_2$ will not always require the use of the first voltage control circuit 60 and may be designed to have the second voltage control circuit 70 alone. On the other hand the differential amplifiers 122, 126 of FIG. 7 for outputting the voltages $V_3$, $V_1$ will not always require the use of the second voltage control circuit 70 and may be modified to have the first voltage control circuit 60 only.

Additionally the above-described differential amplifiers and power supply circuit are applicable not only to various items of electronic equipment including liquid crystal display devices such as portable telephones, game machines and personal computers, but also applicable to other types of electronic equipment operable upon receipt of stable voltages supplied thereto.

What is claimed is:

1. A differential amplifier comprising:
    a first differential amplifier circuit which operates based on a first input voltage and includes a first transistor of a primary conductivity type and a second transistor of the primary conductivity type which makes up a differential pair with the first transistor of the primary conductivity type;
    a second differential amplifier circuit which operates based on a second input voltage and includes a first transistor of a secondary conductivity type and a second transistor of the secondary conductivity type which makes up a differential pair with the first transistor of the secondary conductivity type;
    a third transistor of the secondary conductivity type which operates based on a first signal from the first differential amplifier circuit;
    a third transistor of the primary conductivity type which is serially connected to the third transistor of the secondary conductivity type and operates based on a second signal from the second differential amplifier circuit; and
    a voltage control circuit which controls a voltage of a control terminal of the third transistor of the secondary conductivity type, based on a third signal from the second differential amplifier circuit,
    wherein a voltage between the third transistor of the secondary conductivity type and the third transistor of the primary conductivity type is used as an output voltage.

2. The differential amplifier as defined in claim 1,
    wherein the voltage control circuit includes a fourth transistor of the primary conductivity type which is connected in parallel with a constant current source of the first differential amplifier circuit; and
    wherein the third signal is supplied to a control terminal of the fourth transistor of the primary conductivity type.

3. The differential amplifier as defined in claim 2,
    wherein the third signal is identical to a signal which is supplied to a control terminal of the third transistor of the primary conductivity type.

4. The differential amplifier as defined in claim 1,
    wherein a first capacitor which prevents oscillation of the output voltage is connected to the control terminal of the third transistor of the secondary conductivity type.

5. A differential amplifier comprising:
    a first differential amplifier circuit which operates based on a first input voltage and includes a first transistor of a primary conductivity type and a second transistor of the primary conductivity type which makes up a differential pair with the first transistor of the primary conductivity type;
    a second differential amplifier circuit which operates based on a second input voltage and includes a first transistor of a secondary conductivity type and a second transistor of the secondary conductivity type which makes up a differential pair with the first transistor of the secondary conductivity type;
    a third transistor of the secondary conductivity type which operates based on a first signal from the first differential amplifier circuit;
    a third transistor of the primary conductivity type which is serially connected to the third transistor of the secondary conductivity type and operates based on a second signal from the second differential amplifier circuit; and
    a voltage control circuit which controls a voltage of a control terminal of the third transistor of the primary conductivity type, based on a fourth signal from the first differential amplifier circuit,
    wherein a voltage between the third transistor of the secondary conductivity type and the third transistor of the primary conductivity type is used as an output voltage.

6. The differential amplifier as defined in claim 5,
    wherein the voltage control circuit includes a fourth transistor of the secondary conductivity type which is connected in parallel with a constant current source of the second differential amplifier circuit; and
    wherein the fourth signal is supplied to a control terminal of the fourth transistor of the secondary conductivity type.

7. The differential amplifier as defined in claim 6,
    wherein the fourth signal is identical to a signal which is supplied to a control terminal of the third transistor of the secondary conductivity type.

8. The differential amplifier as defined in claim 5,
    wherein a second capacitor which prevents oscillation of the output voltage is connected to the control terminal of the third transistor of the primary conductivity type.

9. A differential amplifier comprising:
    a first differential amplifier circuit which operates based on a first input voltage and includes a first transistor of a primary conductivity type and a second transistor of the primary conductivity type which makes up a differential pair with the first transistor of the primary conductivity type;
    a second differential amplifier circuit which operates based on a second input voltage and includes a first transistor of a secondary conductivity type and a second transistor of the secondary conductivity type which makes up a differential pair with the first transistor of the secondary conductivity type;
    a third transistor of the secondary conductivity type which operates based on a first signal from the first differential amplifier circuit;
    a third transistor of the primary conductivity type which is serially connected to the third transistor of the secondary conductivity type and operates based on a second signal from the second differential amplifier circuit;
    a first voltage control circuit which controls a voltage of a control terminal of the third transistor of the secondary conductivity type, based on a third signal from the second differential amplifier circuit; and
    a second voltage control circuit which controls a voltage of a control terminal of the third transistor of the primary conductivity type, based on a fourth signal from the first differential amplifier circuit,
    wherein a voltage between the third transistor of the secondary conductivity type and the third transistor of the primary conductivity type is used as an output voltage.

10. A semiconductor device comprising the differential amplifier as defined in claims 1.

11. A semiconductor device comprising the differential amplifier as defined in claims 5.

12. A semiconductor device comprising the differential amplifier as defined in claims 9.

13. A power supply circuit comprising the differential amplifier as defined in claim 1.

14. A power supply circuit comprising the differential amplifier as defined in claim 5.

15. A power supply circuit comprising the differential amplifier as defined in claim 9.

16. Electronic equipment comprising the power supply circuit as defined in claim 13.

17. Electronic equipment comprising the power supply circuit as defined in claim 14.

18. Electronic equipment comprising the power supply circuit as defined in claim 15.

* * * * *